(12) United States Patent
Sim et al.

(10) Patent No.: US 10,797,160 B2
(45) Date of Patent: Oct. 6, 2020

(54) METHODS OF FABRICATING SEMICONDUCTOR DEVICES

(71) Applicant: Samsung Electronics Co., Ltd., Suwon-si, Gyeonggi-do (KR)

(72) Inventors: Hyun-Jun Sim, Hwaseong-si (KR); Won-Oh Seo, Seoul (KR); Sun-Jung Kim, Suwon-si (KR); Ki-Yeon Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 31 days.

(21) Appl. No.: 16/149,387

(22) Filed: Oct. 2, 2018

(65) Prior Publication Data

US 2019/0237563 A1 Aug. 1, 2019

(30) Foreign Application Priority Data

Jan. 31, 2018 (KR) ........................ 10-2018-0012344

(51) Int. Cl.
| | |
|---|---|
| *H01L 29/66* | (2006.01) |
| *H01L 21/28* | (2006.01) |
| *H01L 21/02* | (2006.01) |
| *H01L 27/11* | (2006.01) |
| *H01L 21/3213* | (2006.01) |
| *H01L 29/49* | (2006.01) |

(52) U.S. Cl.
CPC .... *H01L 29/66795* (2013.01); *H01L 21/0228* (2013.01); *H01L 21/02164* (2013.01); *H01L 21/02236* (2013.01); *H01L 21/28185* (2013.01); *H01L 21/28194* (2013.01); *H01L 21/28211* (2013.01); *H01L 27/1104* (2013.01); *H01L 27/1116* (2013.01); *H01L 21/0217* (2013.01); *H01L 21/02252* (2013.01); *H01L 21/02255* (2013.01); *H01L 21/28079* (2013.01); *H01L 21/32134* (2013.01); *H01L 29/4958* (2013.01); *H01L 29/66545* (2013.01)

(58) Field of Classification Search
None
See application file for complete search history.

(56) References Cited

U.S. PATENT DOCUMENTS

| 7,163,877 B2 | 1/2007 | Niimi et al. |
|---|---|---|
| 7,799,649 B2 | 9/2010 | Niimi et al. |
| 8,772,115 B2 | 7/2014 | Son et al. |

(Continued)

FOREIGN PATENT DOCUMENTS

| KR | 10-0729354 | 6/2007 |
|---|---|---|
| KR | 10-0823715 | 4/2008 |

(Continued)

*Primary Examiner* — Anthony Ho
*Assistant Examiner* — Kevin Quinto
(74) *Attorney, Agent, or Firm* — Myers Bigel, P.A.

(57) ABSTRACT

A method of fabricating a semiconductor device may include forming a fin structure on a substrate; forming an interface film having a first thickness on the fin structure using a first process; forming a gate dielectric film having a second thickness on the interface film using a second process different from the first process; and densifying the gate dielectric film using a third process different from the first and second processes. The second thickness may be greater than the first thickness, and the first thickness of the interface film may be unchanged after the densifying of the gate dielectric film.

19 Claims, 13 Drawing Sheets

(56) References Cited

U.S. PATENT DOCUMENTS

| | | |
|---|---|---|
| 2007/0166931 A1 | 7/2007 | Park et al. |
| 2008/0085584 A1 | 4/2008 | Noh et al. |
| 2009/0117751 A1 | 5/2009 | Kim et al. |
| 2011/0053381 A1 | 3/2011 | Kobayashi et al. |
| 2014/0134812 A1 | 5/2014 | Kim et al. |
| 2015/0255581 A1* | 9/2015 | Lin .................... H01L 27/0886 257/401 |
| 2015/0267292 A1* | 9/2015 | Kim .................... C23C 16/4405 427/255.28 |

FOREIGN PATENT DOCUMENTS

| | | |
|---|---|---|
| KR | 10-0907931 | 6/2009 |
| KR | 10-1163264 | 7/2012 |
| KR | 10-1250057 | 4/2013 |
| KR | 1020140061067 | 5/2014 |

* cited by examiner

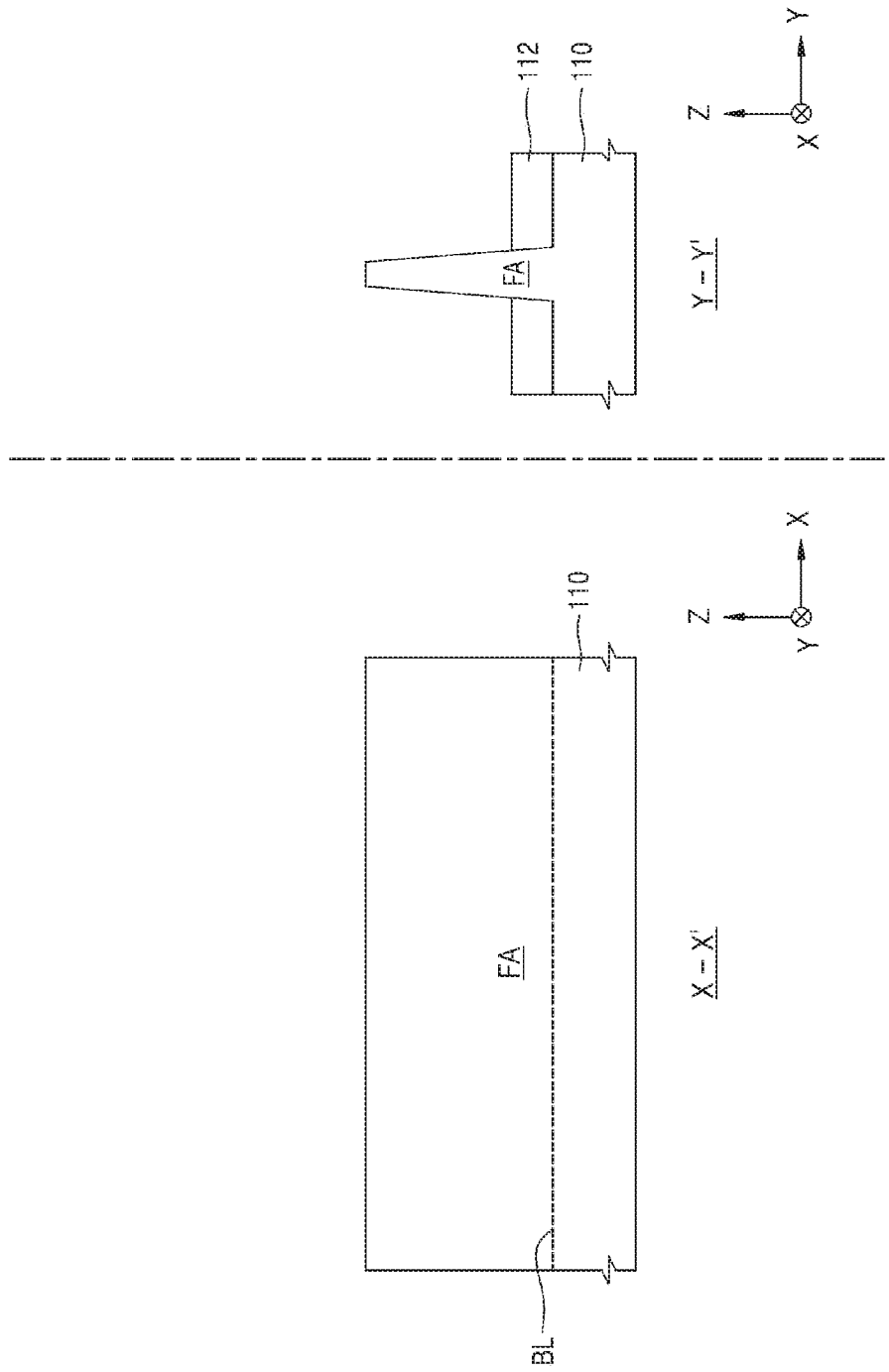

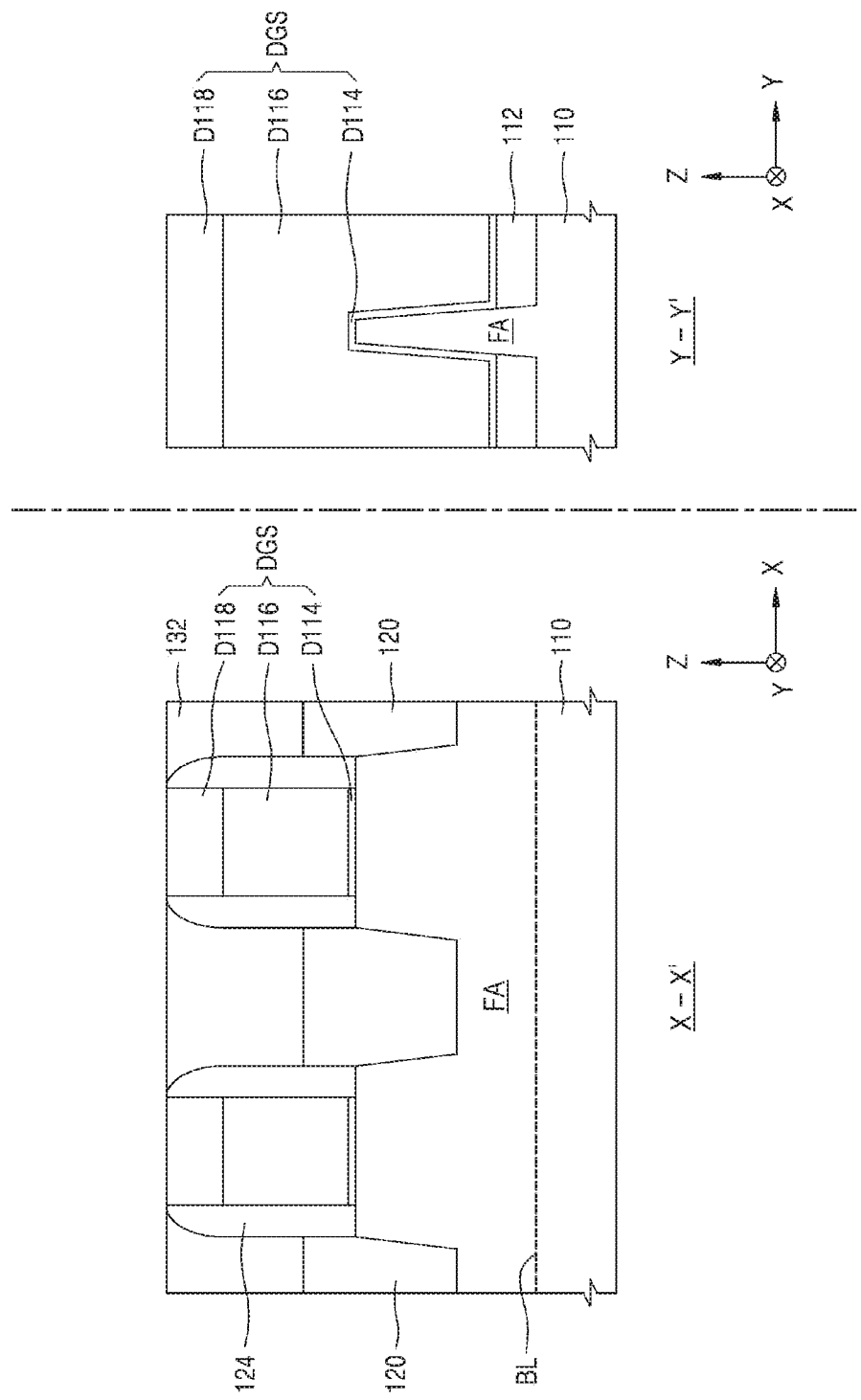

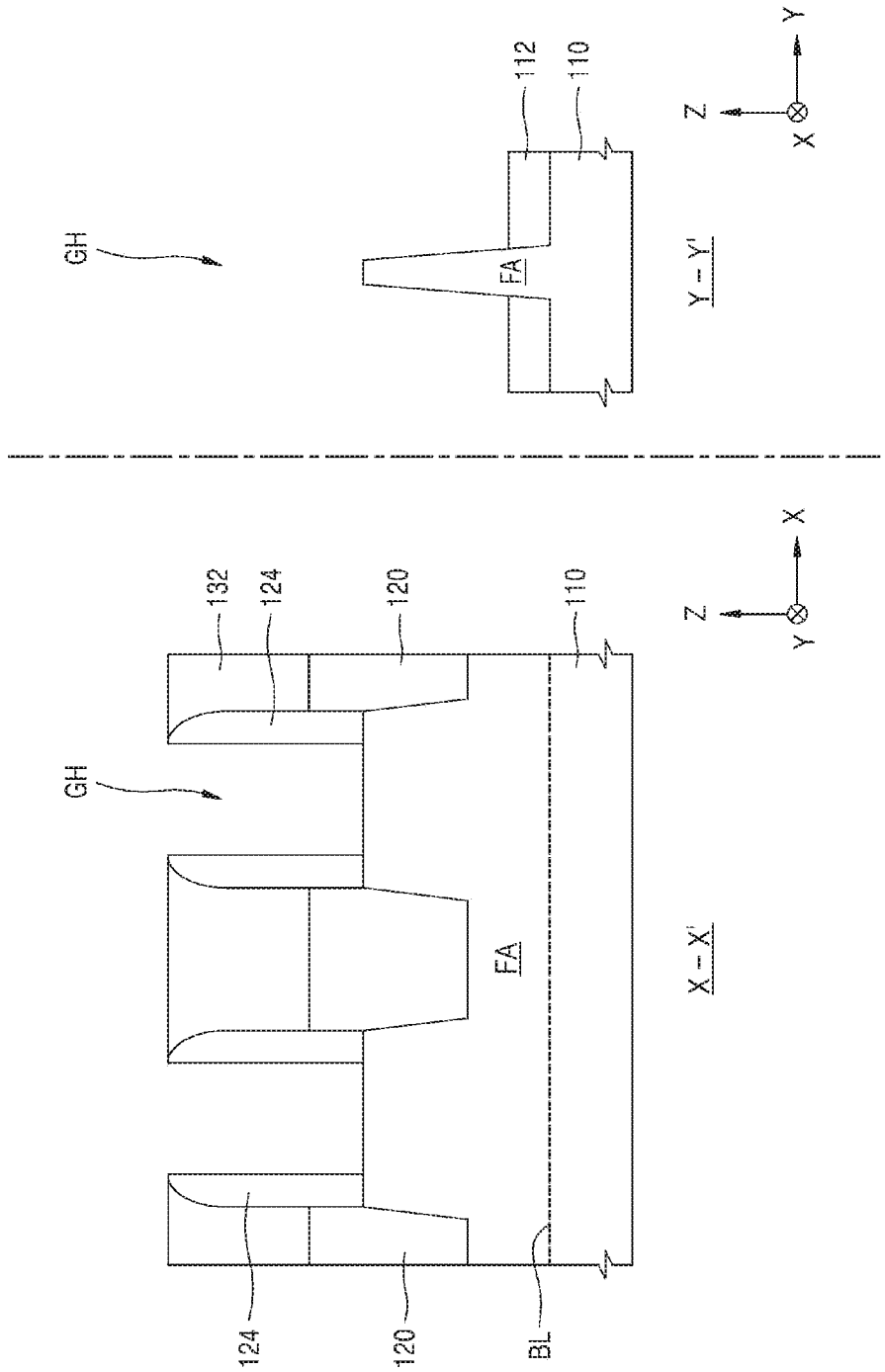

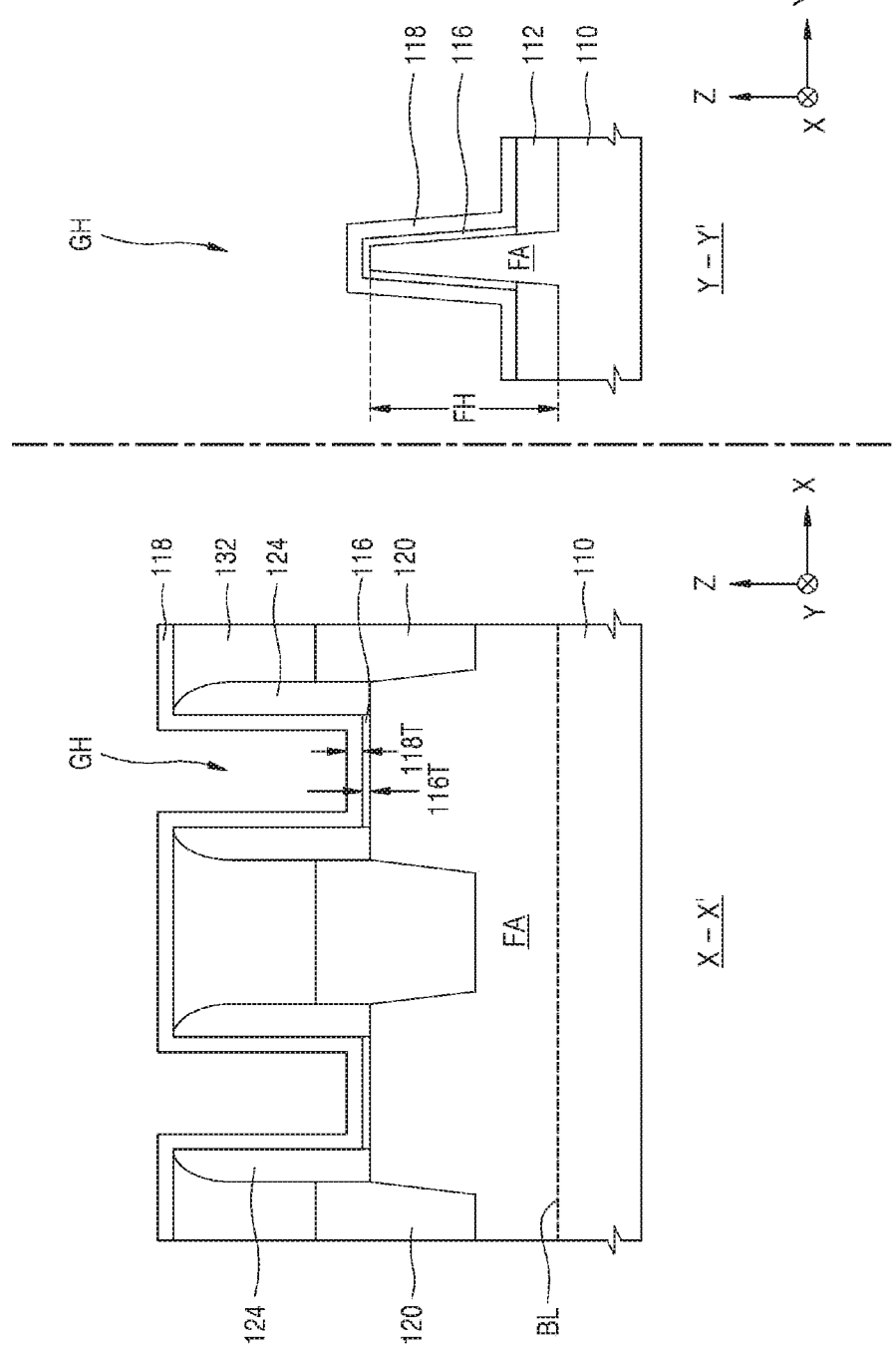

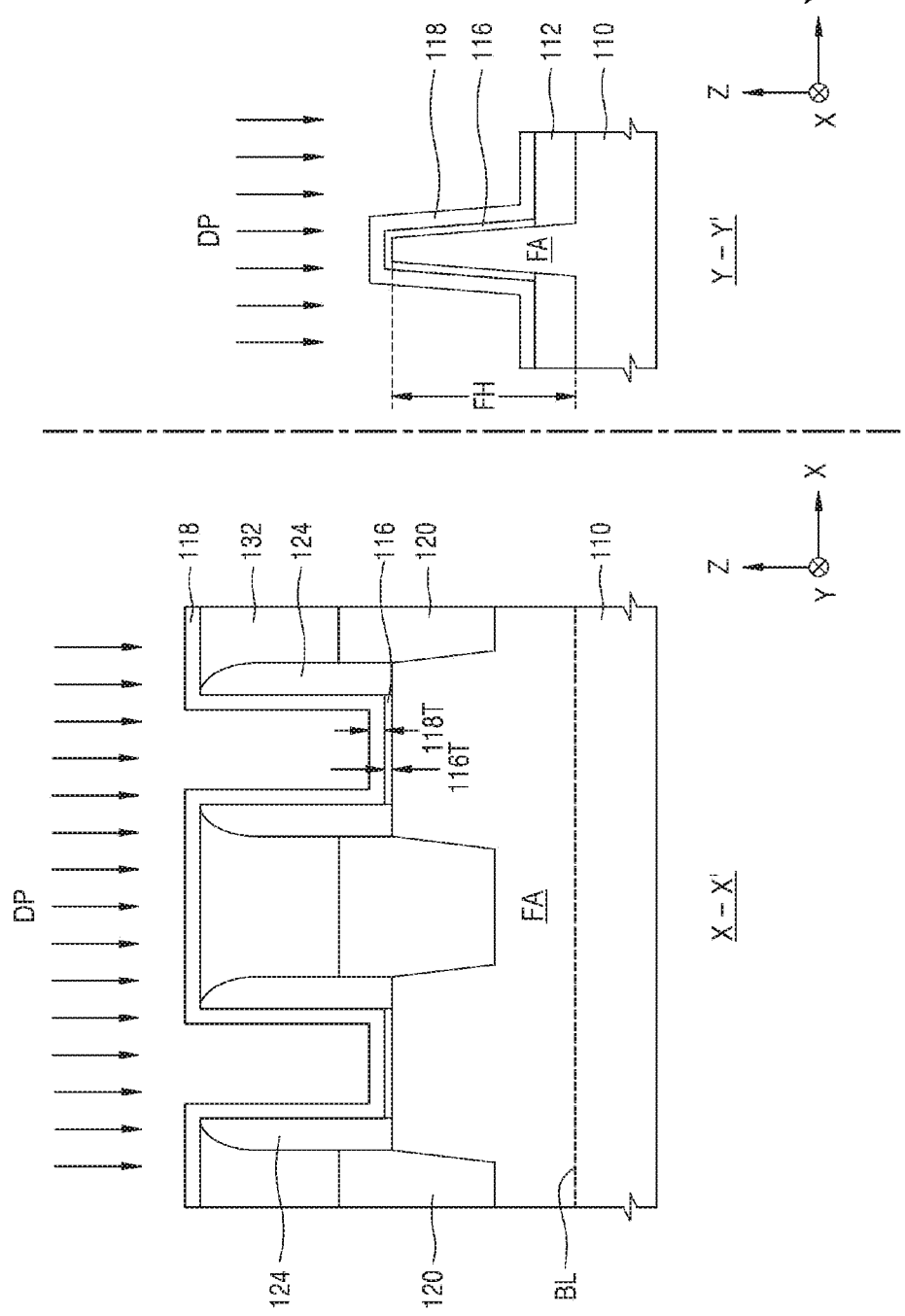

METHODS OF FABRICATING SEMICONDUCTOR DEVICES

CROSS-REFERENCE TO RELATED APPLICATION

This application claims the benefit of Korean Patent Application No. 10-2018-0012344, filed on Jan. 31, 2018, in the Korean Intellectual Property Office, the disclosure of which is incorporated by reference herein in its entirety for all purposes.

TECHNICAL FIELD

The present disclosure relates to methods of fabricating semiconductor devices, and more particularly, to methods of fabricating semiconductor devices that include at least one fin field-effect transistor (FinFET).

BACKGROUND

The size of semiconductor devices has been reduced and is being further reduced so as to realize highly-integrated, high-capacity semiconductor devices. As the size of individual semiconductor devices is reduced, and the distance between semiconductor devices is decreased to increase the degree of integration of semiconductor devices, the density of semiconductor devices per unit of area is increased. However, when the size of semiconductor devices having a two-dimensional structure is reduced, a short-channel effect in which the horizontal channel length is decreased may occur. To prevent the short-channel effect, a FinFET may be used. Due to the structural characteristics of the FinFET, the FinFET may prevent the short-channel effect by securing an effective channel length, and the FinFET increase the magnitude of operating current by increasing a gate width.

SUMMARY

The present disclosure provides methods of fabricating semiconductor devices, by which electrical characteristics and process efficiency may be enhanced.

Some aspects of the inventive concepts provide a method of fabricating a semiconductor device. The method may include forming a fin structure on a substrate; forming an interface film having a first thickness on the fin structure using a first process; forming a gate dielectric film having a second thickness on the interface film using a second process different from the first process; and densifying the gate dielectric film using a third process different from the first and second processes. The second thickness may be greater than the first thickness; put differently, the thickness of the gate dielectric film may be greater than the thickness of the interface film. The first thickness of the interface film may be unchanged after the densifying of the gate dielectric film.

Some aspects of the inventive concepts provide a method of fabricating a semiconductor device. The method may include forming a multi-layer dielectric film structure on a substrate on which a fin structure is formed. The multi-layer dielectric film structure may have a plurality of dielectric films stacked therein. The method may further include performing oxygen plasma processing on the substrate; and forming a gate line on the multi-layer dielectric film structure that has undergone the oxygen plasma processing. The fin structure may not be lost during the performing of the oxygen plasma processing.

Some aspects of the inventive concepts provide a method of fabricating a semiconductor device. The method may include forming a fin structure on a substrate; forming a source/drain region on the fin structure; forming a first silicon oxide film having a first thickness on the fin structure; and forming a second silicon oxide film having a second thickness on the first silicon oxide film. The second thickness may be greater than the first thickness. The method may further include performing plasma processing on the substrate; and forming a gate line on the fin structure to extend in a direction crossing the fin structure and to face the source/drain region.

BRIEF DESCRIPTION OF THE DRAWINGS

The present disclosure, and the example embodiments of the inventive concepts disclosed herein, will be more clearly understood from the following detailed description taken in conjunction with the accompanying drawings in which:

FIGS. 5A through 5G are cross-sectional views of the sequential stages in a method of fabricating a semiconductor device, according to some embodiments of the inventive concepts;

DETAILED DESCRIPTION OF THE EMBODIMENTS

Figure 1A:
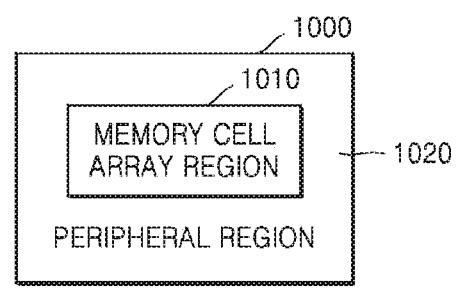
FIGS. 1A and 1B are conceptual diagrams of semiconductor devices fabricated using a method of fabricating a semiconductor device, according to some embodiments of the inventive concepts.
Figure 1B:
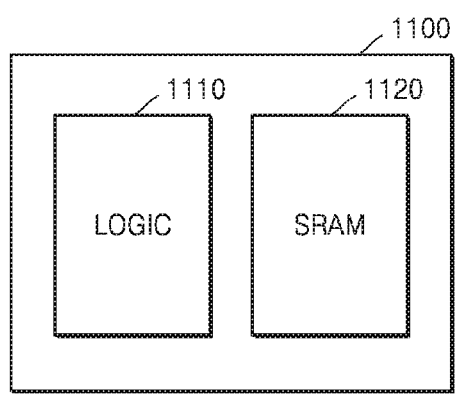

FIGS. 1A and 1B are conceptual diagrams of semiconductor devices fabricated using a method of fabricating a semiconductor device, according to some embodiments of the inventive concepts.

Referring to FIG. 1A, a semiconductor device 1000 may include a memory cell array region 1010 and a peripheral region 1020 around the memory cell array region 1010.

A memory device may be located in the memory cell array region 1010. The memory device may be static random access memory (SRAM), dynamic RAM (DRAM), magnetic RAM (MRAM), phase-change RAM (PRAM), resistive RAM (RRAM), or flash memory, but the present disclosure is not limited thereto.

A circuit device that drives the memory device in the memory cell array region 1010 may be located in the peripheral region 1020. The circuit device may be a read circuit or a write circuit but is not limited thereto.

Referring to FIG. 1B, a semiconductor device 1100 may include a logic region 1110 and an SRAM region 1120.

In some embodiments, a semiconductor device 100 (FIG. 5G) fabricated using a method of fabricating a semiconductor device, which is described herein, may be located in the logic region 1110. Although the logic region 1110 and the SRAM region 1120 are illustrated, the present disclosure is not limited thereto. Together with the logic region 1110, a region in which a different memory device, e.g., DRAM, MRAM, PRAM, RRAM, or flash memory, is formed may be included in the semiconductor device 1100.

Figure 2:
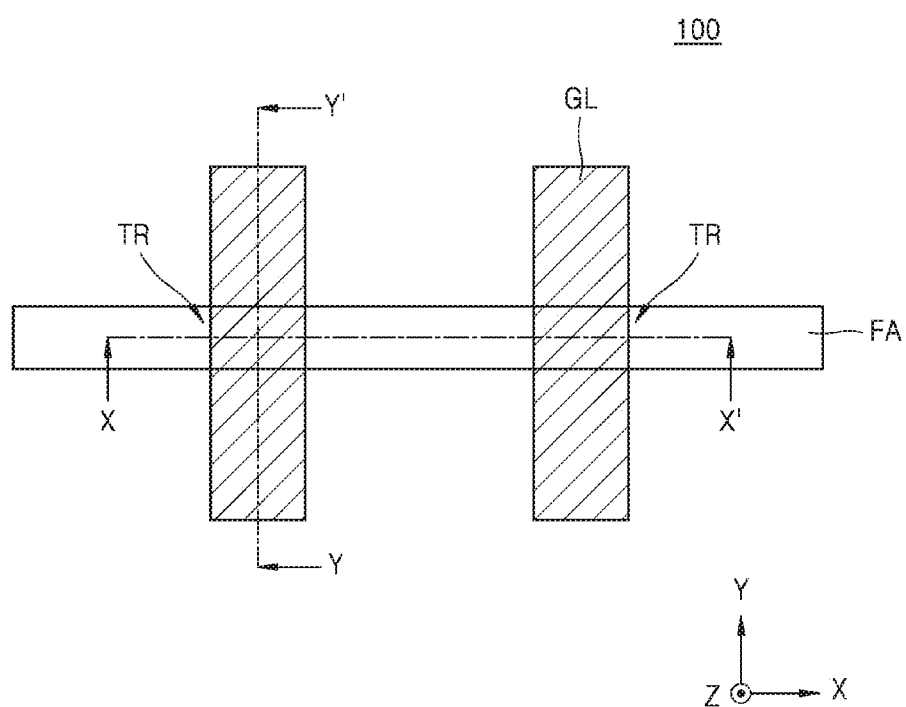
FIG. 2 is a layout diagram of a semiconductor device fabricated using a method of fabricating a semiconductor device, according to some embodiments of the inventive concepts.
Figure 3:
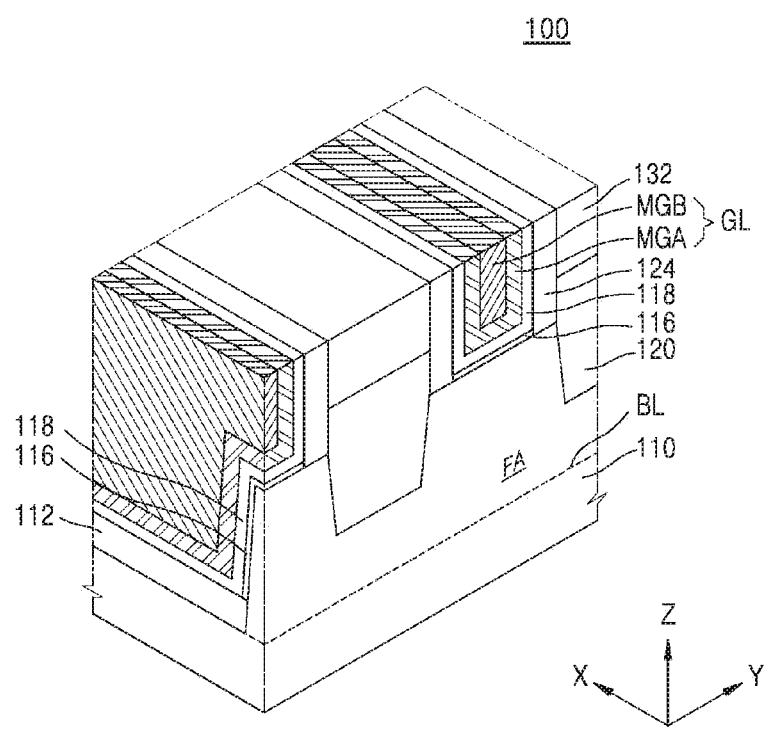
FIG. 3 is a cross-sectional perspective view of a semiconductor device fabricated using a method of fabricating a semiconductor device, according to some embodiments of the inventive concepts.

FIG. 2 is a layout diagram of a semiconductor device fabricated using a method of fabricating a semiconductor device, according to some embodiments of the inventive concepts. FIG. 3 is a cross-sectional perspective view of a semiconductor device fabricated using a method of fabricating a semiconductor device, according to some embodiments of the inventive concepts.

Referring to FIGS. 2 and 3, a semiconductor device 100 may include a substrate 110 including a fin active region FA extending in a first direction (i.e., an X direction). The level of the bottom of the fin active region FA is marked with a dashed line BL in FIG. 3.

The substrate 110 may include a semiconductor such as silicon (Si) or germanium (Ge), or a compound semiconductor such as SiGe, SiC, GaAs, InAs, or InP. In some embodiments, the substrate 110 may include at least one among a Group III-V material and a Group IV material. The Group III-V material may be a compound including at least one Group III element and at least one Group V element.

As an example, the Group III-V material may be a compound including at least one element among indium (In), gallium (Ga), and aluminum (Al) as a Group III element and at least one element among arsenic (As), phosphorus (P), and antimony (Sb) as a Group V element. For example, the Group III-V material may be selected from InP, $In_zGa_{1-z}As$ ($0 \leq z \leq 1$), and $Al_zGa_{1-z}As$ ($0 \leq z \leq 1$).

The Group IV material may be Si or Ge. However, the Group III-V material and the Group IV material which may be used in a semiconductor device according to embodiments of the inventive concepts are not limited to those explicitly recited herein. The Group III-V material, and the Group IV material such as Ge, may be used as channel materials for low-power, high-speed transistors. A high-performance complementary metal-oxide semiconductor (CMOS) may be formed using a semiconductor substrate including the Group III-V material, e.g., GaAs, which may have a higher electron mobility than a Si substrate, and a semiconductor substrate including a semiconductor material, e.g., Ge, which may have a higher hole mobility than the Si substrate.

In some embodiments, when an N-channel MOS (NMOS) transistor is formed on the substrate 110, the substrate 110 may include one of the Group III-V materials described above. In other embodiments, when a P-channel MOS (PMOS) transistor is formed on the substrate 110, the substrate 110 may at least partially include Ge. In other embodiments, the substrate 110 may have a silicon-on-insulator (SOI) structure. The substrate 110 may include a conductive region, e.g., an impurity-doped well or an impurity-doped structure.

A lower side wall of the fin active region FA may be covered with an isolation film 112 on the substrate 110. The fin active region FA may protrude above the isolation film 112 in a fin structure in a third direction (i.e., a Z direction) perpendicular to a main surface (i.e., an X-Y plane) of the substrate 110.

An interface film 116, a gate dielectric film 118, and a gate line GL may extend in a second direction (i.e., a Y direction) that crosses the first direction (i.e., the X direction) on the fin active region FA on the substrate 110.

The gate dielectric film 118 and the gate line GL may extend to cover the top and opposite side walls of the fin active region FA and the top of the isolation film 112. A transistor TR may be formed at an intersection between the fin active region FA and the gate line GL. The transistor TR may be formed as a three-dimensional field-effect transistor (FET) in which a channel is formed across the top and opposite side walls of the fin active region FA.

The interface film 116, the gate dielectric film 118, and the gate line GL may each have side walls opposite each other. Each of the opposite side walls of the interface film 116, the gate dielectric film 118, and the gate line GL may be covered with a gate insulating spacer 124. The gate insulating spacer 124 that covers the opposite side walls of the interface film 116, the gate dielectric film 118, and the gate line GL may not directly contact one or more of the interface film 116, the gate dielectric film 118, and the gate line GL. In some embodiments, the gate insulating spacer 124 may be in contact with the gate dielectric film 118 at a side wall of the gate line GL and include a material, e.g., a silicon nitride film, covering the side wall of the gate line GL.

The interface film 116 may be obtained by oxidizing an exposed surface of the fin active region FA. The interface film 116 may prevent a poor interface between the fin active region FA and the gate dielectric film 118. In some embodiments, the interface film 116 may include a low-k dielectric film, e.g., a silicon oxide layer, a silicon oxynitride film, or a combination thereof. In other embodiments, the interface film 116 may include silicate or a combination of silicate and the low-k dielectric film described above. In other embodiments, the interface film 116 may be referred to as a lower dielectric film.

The gate dielectric film 118 may include a silicon oxide film, a high-k dielectric film, or a combination thereof. The high-k dielectric film may include a material having a higher dielectric constant than the silicon oxide film. The gate dielectric film 118 may be formed using atomic layer deposition (ALD), chemical vapor deposition (CVD), or physical vapor deposition (PVD), but the present disclosure is not limited thereto. In some embodiments, the gate dielectric film 118 may be referred to as an upper dielectric film.

The gate line GL may extend on the gate dielectric film 118 in a direction that crosses the fin active region FA to cover the top and opposite side walls of the fin active region FA. The gate line GL may include a first metal-containing layer MGA and a second metal-containing layer MGB.

The first metal-containing layer MGA may control a work function. The second metal-containing layer MGB may fill a space at an upper portion of the first metal-containing layer MGA. In some embodiments, the first metal-containing layer MGA may include titanium (Ti), tantalum (Ta), aluminium (Al), and a metal including a combination thereof. In some embodiments, the first metal-containing layer MGA may include a single film or multiple films.

The second metal-containing layer MGB may include an upper work function control film, a conductive barrier film, a gap-fill metal film, or a combination thereof. The upper work function control film may include TiAl, TiAlC, TiAlN, TiC, TaC, HfSi, or a combination thereof, but the present disclosure is not limited thereto. The conductive barrier film may include a metal nitride film, e.g., TiN, TaN, or a combination thereof, but the present disclosure is not limited thereto. The gap-fill metal film may be formed to fill a gate space remaining on the conductive barrier film. The gap-fill metal film may include tungsten (W). The upper work function control film, the conductive barrier film, and the gap-fill metal film may be formed using ALD, CVD, or PVD. In some embodiments, at least one film among the upper work function control film, the conductive barrier film, and the gap-fill metal film may be omitted.

A source/drain region 120 may be formed at each side of the gate line GL on the fin active region FA. The source/drain region 120 may include a semiconductor layer epitaxially grown on the fin active region FA. In some embodiments, the source/drain region 120 may have an embedded SiGe structure including an epitaxially-grown SiGe layer. The SiGe layer may have different Ge contents. In other embodiments, the source/drain region 120 may include an epitaxially-grown Si layer or an epitaxially-grown SiC layer.

An inter-gate insulating film 132 may be formed between gate lines GL. The inter-gate insulating film 132 may be formed between two adjacent gate lines GL, and may cover the source/drain region 120. The inter-gate insulating film 132 may include a silicon oxide film, but the present disclosure is not limited thereto.

After the gate dielectric film 118 is formed using ALD, densification may be performed according to some embodiments of the inventive concepts of the present disclosure. The gate dielectric film 118 formed using ALD may not be dense and may have defects, which may be numerous. In particular, the gate dielectric film 118 formed using ALD may cause leakage current due to poor interface characteristics. Therefore, when the gate dielectric film 118 formed using ALD is densified using densification according to some embodiments of the inventive concepts, a gate dielectric film 118 with improved interface characteristics may be formed. In addition, densification may be performed, using low-temperature plasma, on the substrate 110 on which the interface film 116 and the gate dielectric film 118 have been formed, and therefore, a gate dielectric film 118 with a dense structure may be formed while consumption of Si forming a fin structure included in the substrate 110 is suppressed, reduced, or minimized.

According to some embodiments of the inventive concepts, a method of fabricating a semiconductor device, by which electrical characteristics and process efficiency are enhanced, may be realized.

Figure 4:
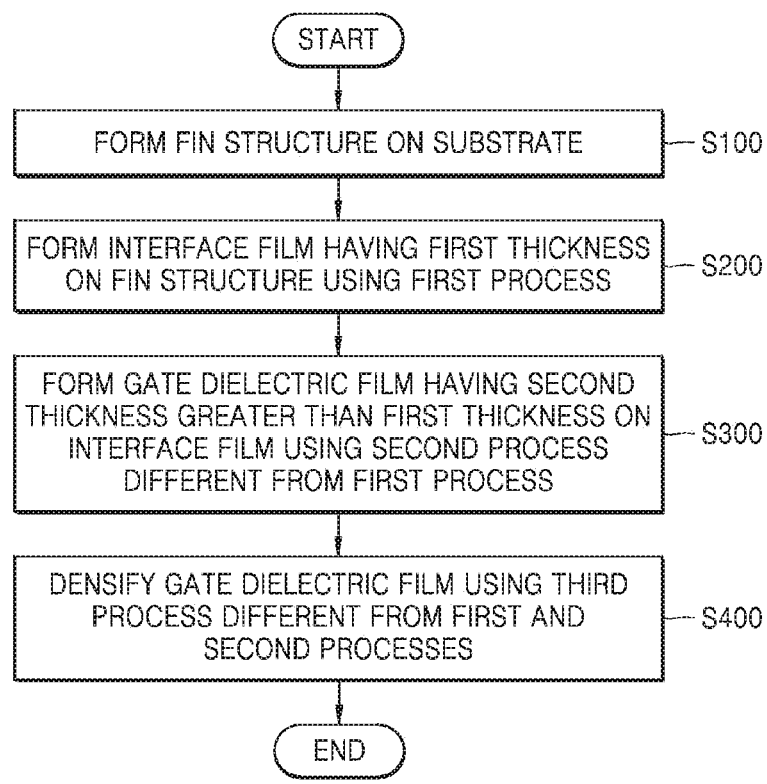
FIG. 4 is a flowchart of a method of fabricating a semiconductor device, according to some embodiments of the inventive concepts.

FIG. 4 is a flowchart of a method of fabricating a semiconductor device, according to some embodiments of the inventive concepts.

Referring to FIG. 4, the method includes forming a fin structure on a substrate in operation S100, forming an interface film having a first thickness on the fin structure using a first process in operation S200, forming a gate dielectric film having a second thickness greater than the first thickness on the interface film using a second process different from the first process in operation S300, and densifying the gate dielectric film using a third process different from the first and second processes in operation S400.

As discussed herein, it is desirable to reduce the size of semiconductor devices, so as to realize highly-integrated, high-capacity semiconductor devices. As the size of individual semiconductor devices is reduced and the distance between semiconductor devices is decreased to increase the degree of integration of semiconductor devices, the density of semiconductor devices may be increased. However, when the size of semiconductor devices having a two-dimensional structure is reduced, a short-channel effect in which the horizontal channel length is decreased may occur. To prevent the short-channel effect, a fin field-effect transistor (FinFET) may be used. Due to the structural characteristics of the FinFET, the FinFET may prevent the short-channel effect by securing an effective channel length, and the FinFET may increase the magnitude of operating current by increasing a gate width.

However, as the size of a fin structure forming the FinFET is decreased, in part to realize highly-integrated devices, a semiconductor fabrication method for suppressing loss of the fin structure and improving the characteristics of a gate dielectric film is desirable, as this may thereby enhance electrical characteristics of the semiconductor device.

The inventive concepts relate to a method of fabricating a semiconductor device using low-temperature plasma processing, thereby suppressing loss of a fin structure and densifying a gate dielectric film. An example method that includes operations S100 through S400 will be described in detail with reference to FIGS. 5A through 5G below.

FIGS. 5A through 5G are cross-sectional views of the sequential stages in a method of fabricating a semiconductor device, according to some embodiments of the inventive concepts.

In detail, cross-sectional views of the sequential stages taken along line X-X' in FIG. 2 are illustrated on the left side of the long-short dashed line and cross-sectional views of the sequential stages taken along line Y-Y' in FIG. 2 are illustrated on the right side of the long-short dashed line.

Referring to FIG. 5A, the substrate 110 may be prepared. The type and material of the substrate 110 are the same as those described above, and thus detailed descriptions thereof will be omitted here. In some embodiments, the substrate 110 may have a predetermined MOS region, e.g., a PMOS region or an NMOS region.

The substrate 110 may be partially etched to form the fin active region FA, which may protrude above the main surface (i.e., the X-Y plane) of the substrate 110 in a third direction (i.e., the Z direction), and which may extend in the first direction (i.e., the X direction). The level of the bottom of the fin active region FA is marked with the dashed line BL.

In some embodiments, the portion of the substrate 110 illustrated in FIG. 5A may be a region for forming either a PMOS transistor or an NMOS transistor. The fin active region FA may include P- or N-type impurity diffusion regions (not shown) according to a channel type of a MOS transistor to be formed therein.

An insulating film covering the fin active region FA may be formed on the substrate 110 and then may be etched back to form the isolation film 112. The fin active region FA may protrude above the isolation film 112 and thus may be exposed or partially exposed, as best seen on the right side (Y-Y') of FIG. 5A.

The isolation film 112 may include a silicon oxide film, a silicon nitride film, a silicon oxynitride film, or a combination thereof. The isolation film 112 may include an insulating liner (not shown) including a thermal oxide film and a burying insulating film (not shown) formed on the insulating liner.

Referring to FIG. 5B, a dummy gate structure DGS may be formed on the fin active region FA to extend crossing the fin active region FA.

The dummy gate structure DGS may include a dummy gate dielectric film D114, a dummy gate line D116, and a dummy gate capping layer D118, which may be sequentially stacked on the fin active region FA. In some embodiments, the dummy gate dielectric film D114 may include a silicon oxide film. The dummy gate line D116 may include a polysilicon. The dummy gate capping layer D118 may include at least one film among a silicon oxide film, a silicon nitride film, and a silicon oxynitride film.

Thereafter, the gate insulating spacer 124 may be formed at each of the opposite side walls of the dummy gate structure DGS. The gate insulating spacer 124 may include a silicon nitride film covering each side wall of the dummy gate structure DGS. ALD, CVD, or PVD may be used to form the gate insulating spacer 124.

Thereafter, the source/drain region 120 may be formed by forming a semiconductor layer on the fin active region FA, which has been exposed at each side of the dummy gate structure DGS, using epitaxial growth. The source/drain region 120 may have a higher top level than the fin active region FA.

Although not shown, the source/drain region 120 may have a particular cross-sectional shape. For example, the cross-section of the source/drain region 120 taken along a Y-Z plane may have a shape of a polygon such as a tetragon, a pentagon, or a hexagon, a circle, or an ellipse, although the present disclosure is not limited to these shapes.

The source/drain region 120 may include an impurity-doped semiconductor layer. In some embodiments, the source/drain region 120 may include impurity-doped Si, SiGe, or SiC.

Thereafter, the inter-gate insulating film 132 may be formed to cover the source/drain region 120, the dummy gate structure DGS, and the gate insulating spacer 124.

In some embodiments, an insulating film covering the source/drain region 120, the dummy gate structure DGS, and the gate insulating spacer 124 with a sufficient thickness may be formed. Thereafter, the resultant structure including the insulating film may be planarized to expose the dummy gate structure DGS, so that the inter-gate insulating film 132 having a planarized top may be formed.

Referring to FIG. 5C, a gate hole GH may be formed by removing the dummy gate structure DGS (of FIG. 5B) exposed through the inter-gate insulating film 132.

The gate insulating spacer 124 and the fin active region FA may be exposed through the gate hole GH.

Wet etching may be used to remove the dummy gate structure DGS (of FIG. 5B). To perform the wet etching, an etchant including $HNO_3$, diluted fluoric acid (DHF), $NH_4OH$, tetramethyl ammonium hydroxide (TMAH), KOH, or a combination thereof may be used, but the present disclosure is not limited thereto.

As the dummy gate structure DGS (of FIG. 5B) is removed by the etchant during the wet etching performed to remove the dummy gate structure DGS (of FIG. 5B), the gate insulating spacer 124 may be exposed to the etchant. The gate insulating spacer 124 may be formed of a material having a relatively high resistance against the etchant that is used to remove the dummy gate structure DGS (of FIG. 5B).

Referring to FIG. 5D, the interface film 116 and the gate dielectric film 118 may be sequentially formed to fill the gate hole GH.

A process of forming the interface film 116 may include a process of partially oxidizing the fin active region FA exposed in the gate hole GH. The interface film 116 may prevent interface failure between the gate dielectric film 118 formed thereon and the fin active region FA therebelow. In some embodiments, the interface film 116 may include a silicon oxide film, a silicon oxynitride film, a silicate film, or a combination thereof.

The gate dielectric film 118 may be formed to cover (e.g., conformally cover) the top of the interface film 116, the side walls of the gate insulating spacer 124, and the top of the inter-gate insulating film 132.

The gate dielectric film 118 may include a silicon oxide film, a high-k dielectric film, or a combination thereof. The high-k dielectric film may include a material having a higher dielectric constant than the silicon oxide film. For example, the gate dielectric film 118 may have a dielectric constant of about 10 to about 25.

The gate dielectric film 118 may be formed along the top of the interface film 116 and the side of the gate hole GH. The gate dielectric film 118 may have a uniform thickness, i.e., a second thickness 118T. In some embodiments, a first thickness 116T of the interface film 116 may be less than the second thickness 118T of the gate dielectric film 118.

The interface film 116 may be formed using thermal oxidation and the gate dielectric film 118 may be formed using ALD. At this time, the processing temperature for the thermal oxidation may be higher than that for the ALD.

In detail, forming the gate dielectric film 118 using ALD may be performed at a temperature of about 200° C. to about 800° C. A silicon precursor may be provided first. A single silicon layer may be formed by the silicon precursor along the top of the interface film 116, the side walls of the gate insulating spacer 124, and the top of the inter-gate insulating film 132. A purge may be performed to remove a silicon precursor residue not bonded to the top of the interface film 116, the side walls of the gate insulating spacer 124, and the top of the inter-gate insulating film 132. After the purge, the single silicon layer may be oxidized. An oxygen precursor may be provided to form a silicon oxide film by oxidizing the single silicon layer. After the single silicon layer is oxidized into the silicon oxide film, a purge may be performed to remove the oxygen precursor. These processes complete a cycle of generating a silicon oxide film using ALD. The cycle may be repeatedly performed so that the gate dielectric film 118 including the silicon oxide film has a desired thickness.

The gate dielectric film 118 formed using ALD is formed (e.g., conformally formed) along the top of the interface film 116, the side walls of the gate insulating spacer 124, and the top of the inter-gate insulating film 132. A Si source may be provided during the ALD, and therefore, the gate dielectric film 118 may be formed to have the second thickness 118T which is uniform, and loss of the fin structure may be prevented.

Referring to FIG. 5E, the gate dielectric film 118 may be densified through a densification process DP. The densification process DP may oxidize the gate dielectric film 118 formed along the top of the interface film 116, the side walls of the gate insulating spacer 124, and the top of the inter-gate insulating film 132. In other words, when the gate dielectric film 118 includes a silicon oxide film, the silicon oxide film may be reoxidized through the densification process DP.

As described above, after the gate dielectric film 118 with a desired thickness is formed using ALD, the densification process DP may be performed. The gate dielectric film 118 formed using ALD may not be dense and may have defects, which may be numerous. In particular, the gate dielectric film 118 formed using ALD may cause leakage current due to poor interface characteristics. Therefore, when the gate dielectric film 118 formed using ALD is oxidized through the densification process DP, a gate dielectric film 118 with improved interface characteristics may be formed.

The densification process DP may be performed by plasma processing. Since high-temperature processing such as thermal oxidation involves oxidation of Si included in the fin structure, the high-temperature processing may cause loss of the fin structure. This may lead to degradation of characteristics of semiconductor devices in which the size of a fin structure is reduced with the high degree of integration. However, when the densification process DP is performed on the substrate 110, on which the gate dielectric film 118 has been formed, using low-temperature plasma, consumption of Si forming the fin structure included in the substrate 110 may be suppressed, reduced, or minimized, and the gate dielectric film 118 may have a dense structure or denser structure.

After the plasma processing is performed as the densification process DP, the degree of oxidation of the gate dielectric film 118 may increase and the strain between Si atoms and oxygen (O) atoms forming the gate dielectric film 118 may decrease. In other words, the gate dielectric film 118 may be densified.

In addition, the first thickness 116T of the interface film 116 after the densification process DP may substantially be the same as that before the densification process DP. In other words, a height FH of the fin structure after the densification process DP may also be the same as that before the densification process DP. This may be because the temperature during the plasma processing performed as the densification process DP is lower than the temperature during the thermal oxidation used to form the interface film 116.

The characteristics of the gate dielectric film 118 after the densification process DP will be described in detail with reference to FIG. 6 below. A plasma processing apparatus for performing the plasma processing will also be described in detail with reference to FIG. 7 below.

Figure 5F:
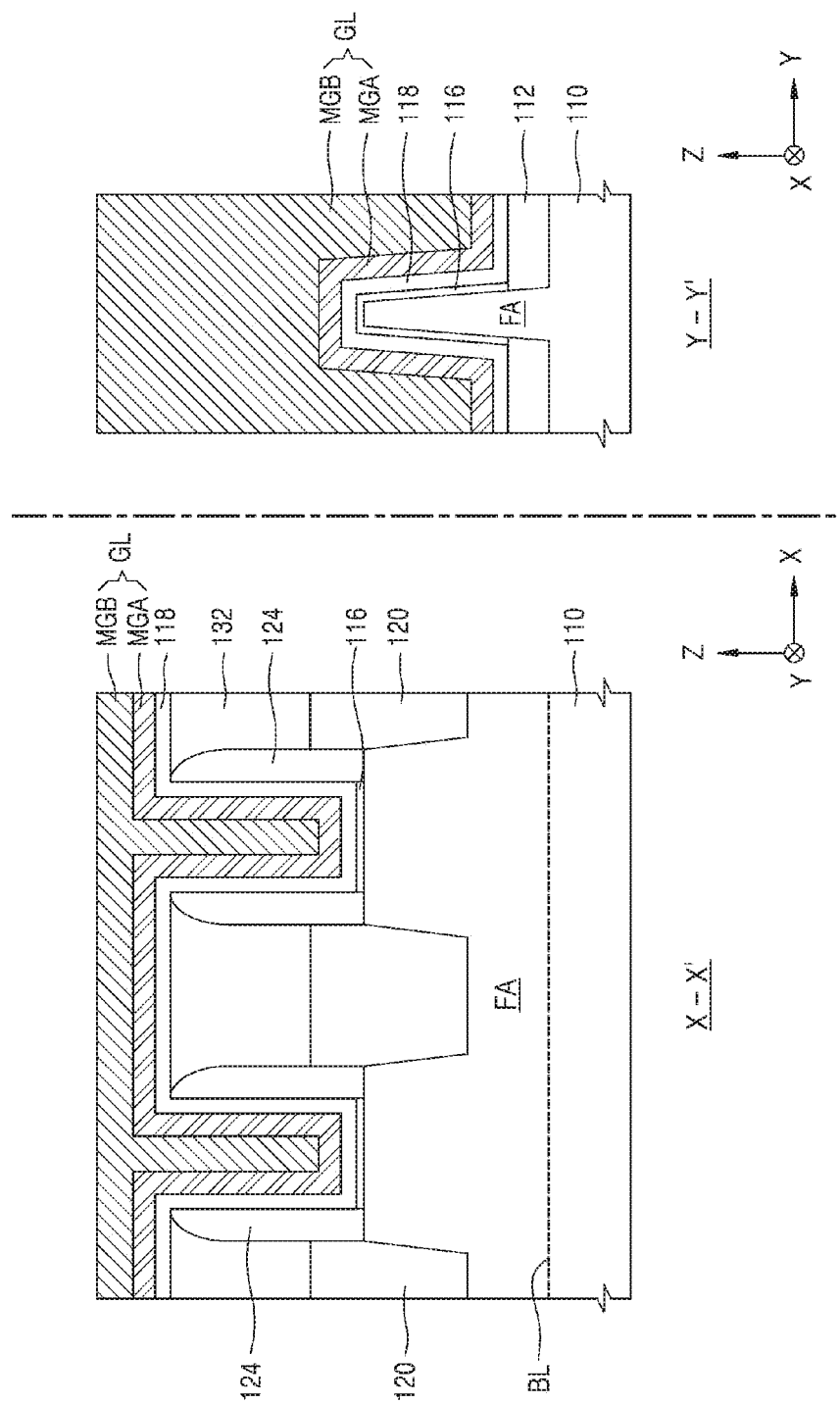

Referring to FIG. 5F, the gate line GL may be formed to fill the gate hole GH (of FIG. 5D).

The gate line GL may sequentially include the first metal-containing layer MGA and the second metal-containing layer MGB. In some embodiments, the first metal-containing layer MGA and the second metal-containing layer MGB may be formed using ALD, metal organic ALD (MOALD), or metal organic CVD (MOCVD), but the inventive concepts are not limited thereto. Since the gate line GL includes a metal, the gate line GL may be referred to as a metal gate structure.

Figure 5G:
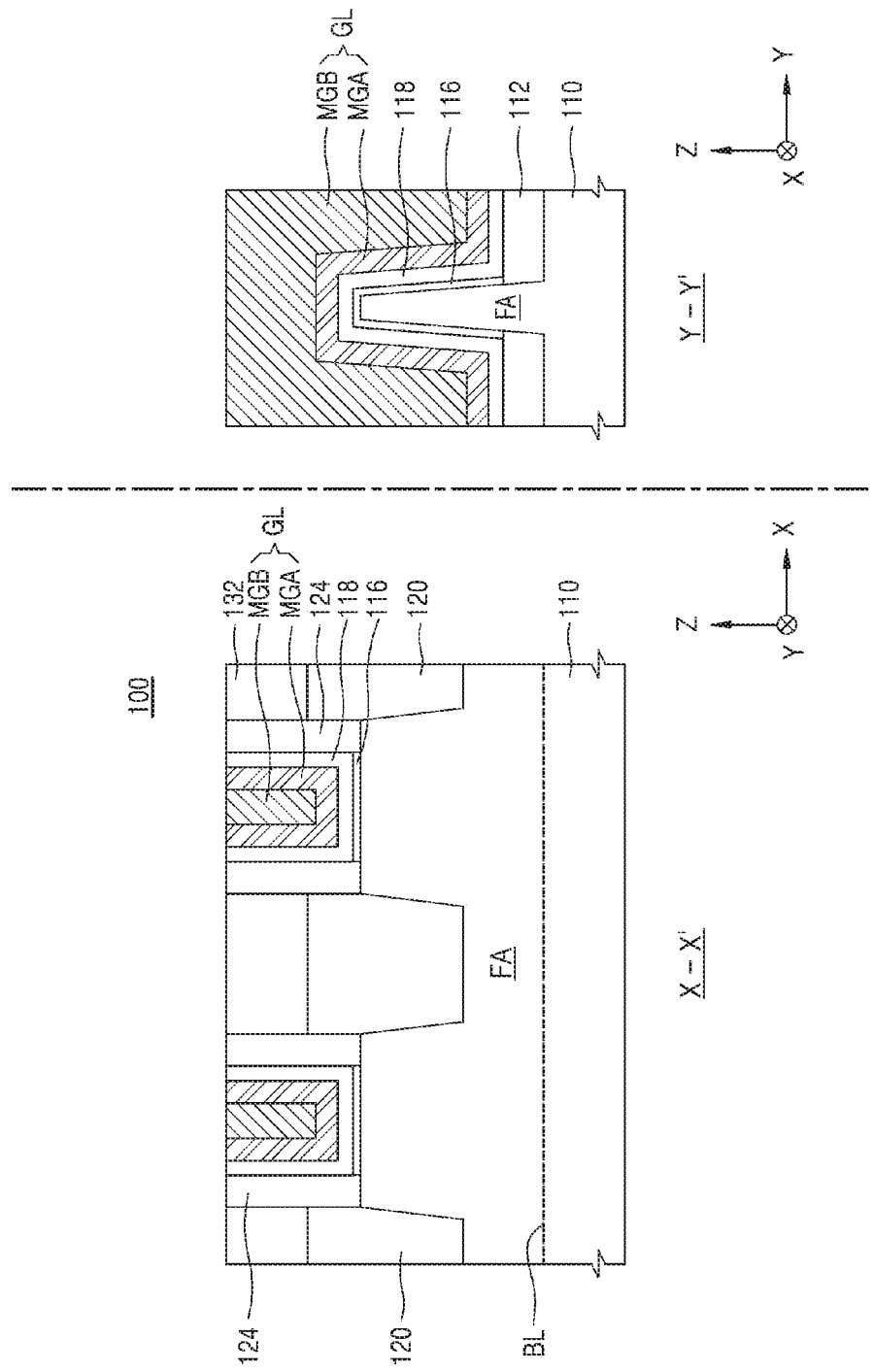

Referring to FIG. 5G, unnecessary portions may be removed by performing planarization on the resultant structure of FIG. 5F, so that the gate line GL and the gate dielectric film 118 are separated into gate lines GL remaining in respective gate holes GH (of FIG. 5D) and gate dielectric films 118 remaining in the respective gate holes GH (of FIG. 5D).

As a result of the planarization, the gate insulating spacer 124 and the inter-gate insulating film 132 may be consumed by a predetermined thickness from the tops thereof, so that the vertical thickness, i.e., the size in the third direction (i.e., the Z direction), of the gate insulating spacer 124 and the inter-gate insulating film 132 may decrease, and the tops (e.g., top surfaces) of the gate dielectric film 118, the gate insulating spacer 124, and the inter-gate insulating film 132 may be exposed around the top of each gate line GL. Put differently, the top surfaces of the gate line GL, the gate dielectric film 118, the gate insulating spacer 124, and the inter-gate insulating film 132 may all be a same distance from the level of the bottom of the fin active region FA (e.g., the marked line BL in FIG. 5G). The planarization may be an etch-back process or a chemical mechanical polishing (CMP) process.

When a method of fabricating a semiconductor device, according to some embodiments of the inventive concepts, is used, a semiconductor device including a FinFET having enhanced electrical characteristics and process efficiency may be fabricated.

Figure 6:
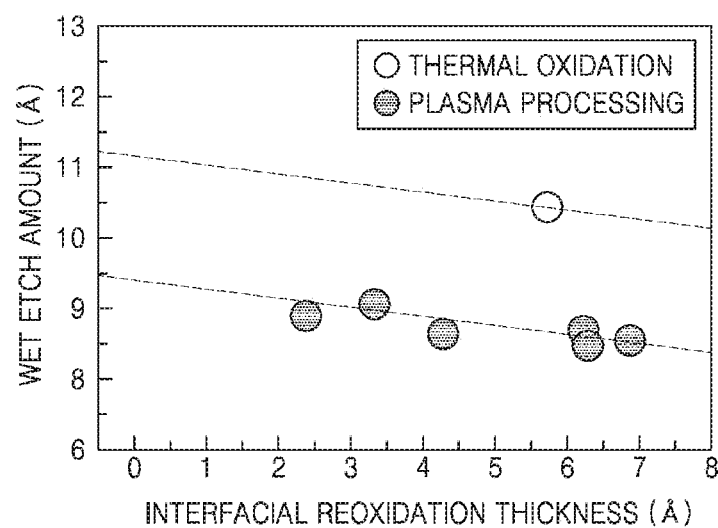
FIG. 6 is a graph showing characteristics of a semiconductor device fabricated using a method of fabricating a semiconductor device, according to some embodiments of the inventive concepts.

FIG. 6 is a graph showing characteristics of a semiconductor device fabricated using a method of fabricating a semiconductor device, according to some embodiments of the inventive concepts.

FIG. 6 shows the relationship between an interfacial reoxidation thickness and a wet etch amount when the gate dielectric film 118 (of FIG. 5E) that has undergone the densification process DP (of FIG. 5E) is immersed in DHF solution.

As compared to a gate dielectric film that has undergone thermal oxidation as a densification process, the gate dielectric film 118 (of FIG. 5E) that has undergone plasma processing as the densification process DP (of FIG. 5E) according to some embodiments of the inventive concepts shows a constant wet etch amount and suppressed interface growth in the DHF solution. In addition, since the plasma processing may be performed at a lower temperature than the thermal oxidation, the wet etch amount may be suppressed, reduced, or minimized, with respect to the same interfacial reoxidation thickness.

Figure 7:
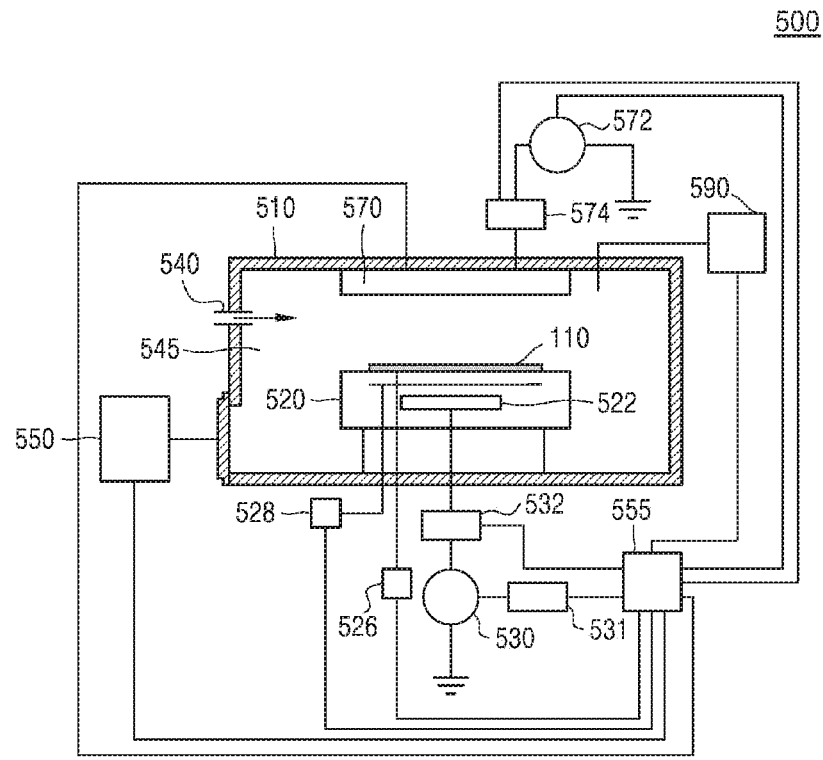
FIG. 7 is a schematic diagram of a plasma processing apparatus used in a method of fabricating a semiconductor device, according to some embodiments of the inventive concepts.

FIG. 7 is a schematic diagram of a plasma processing apparatus used in a method of fabricating a semiconductor device, according to some embodiments of the inventive concepts.

Referring to FIG. 7, a plasma processing apparatus 500 includes a process chamber 510, a substrate holder 520 to which the substrate 110 is attached, and a vacuum pump system 550. The substrate 110 may be as described elsewhere herein. The process chamber 510 may be configured to facilitate the generation of plasma in a process region 545. An ionized gas or a mixture of process gases may be injected through a gas distribution system 540. A process gas may be provided by injecting an oxygen-containing gas into an inert gas. The inert gas may be helium (He), and the oxygen-containing gas may be $O_2$ or $N_2O$. A value or ratio of $O_2/(He+O_2)$ in the process gas may be adjusted to be a maximum of 0.5 using the gas distribution system 540. For the flow of the process gas, a process pressure may be controlled using the vacuum pump system 550

The substrate 110 may be attached to the substrate holder 520 using a clamp system 528. The substrate holder 520 may include a heating/cooling system (not shown) configured to control the temperatures of the substrate holder 520 and the substrate 110.

Heat transfer material may be delivered to the backside of the substrate 110 using a backside control system 526 so as to increase heat conduction between the substrate 110 and the substrate holder 520. The backside control system 526 may be used when the temperature of the substrate 110 needs to be controlled.

The substrate holder 520 may include a lower electrode 522. Radio frequency (RF) power may be provided to plasma in the process region 545 through the lower electrode 522. For example, the substrate holder 520 may be electrically biased at an RF voltage upon receiving the RF power from an RF generator 530 through an impedance matching network 532. RF bias may create and maintain plasma. The plasma may include an oxygen radical. The oxygen radical may be created from an oxygen-containing gas, e.g., $O_2$ or $N_2O$, in a process gas provided using the gas distribution system 540.

The plasma may be created using a remote oxygen plasma method or a direct oxygen plasma method. The electrical bias of the lower electrode 522 at the RF voltage may be pulsed using a bias signal controller 531. The RF power is applied to the lower electrode 522 at different frequencies. The impedance matching network 532 may enhance the supply of the RF power to the plasma in the process chamber 510 by decreasing reflected power.

A controller 555 may monitor outputs of the plasma processing apparatus 500 and generate control voltages enough to transfer and activate inputs of the plasma processing apparatus 500. The controller 555 may be connected to the backside control system 526, the clamp system 528, the RF generator 530, the bias signal controller 531, the impedance matching network 532, the gas distribution system 540, and the vacuum pump system 550 and exchange data.

The plasma processing apparatus 500 may also include an upper electrode 570. RF power from an upper RF generator 572 may be coupled to the upper electrode 570 through an upper impedance matching network 574.

The plasma processing apparatus 500 may also include a process temperature controller 590. The plasma processing apparatus 500 may adjust a process temperature of the process region 545 to about 300° C. to about 700° C. using the process temperature controller 590, in performing the densification process DP (of FIG. 5E). Since this process temperature is low enough to prohibit thermal oxidation from occurring in the substrate 110, Si consumption in the fin structure formed on the substrate 110 is suppressed, reduced, or minimized while the gate dielectric film 118 (of FIG. 5E) is densified. As a result, a semiconductor device having enhanced electrical characteristics may be fabricated.

Figure 8:
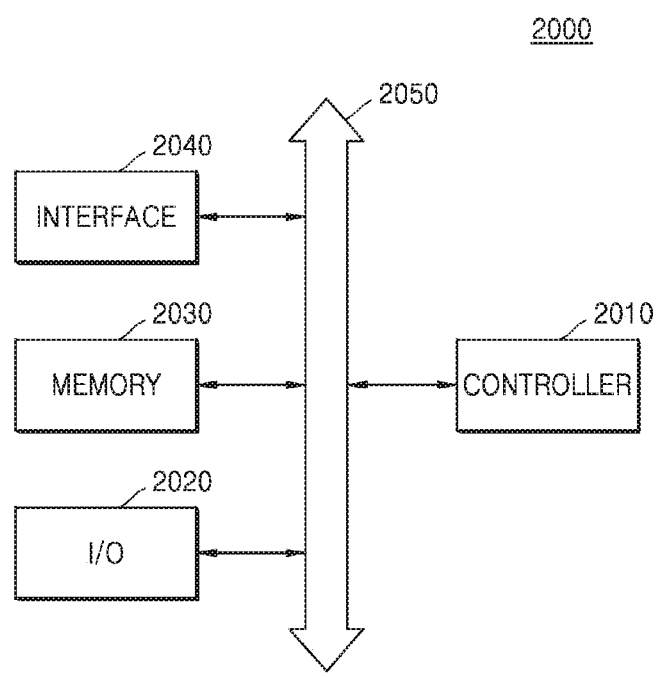
FIG. 8 is a block diagram of a system including a semiconductor device fabricated using a method of fabricating a semiconductor device, according to some embodiments of the inventive concepts.

FIG. 8 is a block diagram of a system including a semiconductor device fabricated using a method of fabricating a semiconductor device, according to some embodiments of the inventive concepts.

Referring to FIG. 8, a system 2000 may include a controller 2010, an input/output (I/O) device 2020, a memory device 2030, an interface 2040, and a bus 2050.

The system 2000 may be a mobile system or a system for transmitting and/or receiving information. In some embodiments, the mobile system may be a portable computer, a web tablet, a mobile phone, a digital music player, or a memory card, but the present disclosure is not limited to such systems.

The controller 2010 may control executable programs in the system 2000. The controller 2010 may include a microprocessor, a digital signal processor, a microcontroller, or the like.

The I/O device 2020 may be used for input and/or output of data to or from the system 2000. The system 2000 may be connected to and may exchange data with an external device, e.g., a personal computer or a network, through the I/O device 2020. The I/O device 2020 may be a touch pad, a keyboard, or a display.

The memory device 2030 may store data, including data used for the operation of the controller 2010 and/or other data, which has been or may be processed by the controller 2010. The memory device 2030 may include the semiconductor device 100 (of FIG. 5G) fabricated using a method of fabricating a semiconductor device that is according to the inventive concepts of the present disclosure.

The interface 2040 may be a data transmission passage between the system 2000 and an external device. The controller 2010, the I/O device 2020, the memory device 2030, and the interface 2040 may communicate with one another through the bus 2050.

While the inventive concepts have been particularly shown and described with reference to example embodiments thereof, it will be understood that various changes in form and details may be made therein without departing from the scope of the following claims.

What is claimed is:

1. A method of fabricating a semiconductor device, the method comprising:
forming a fin structure on a substrate;
forming an interface film having a first thickness on the fin structure using a first process;
forming a gate dielectric film having a second thickness on the interface film using a second process that is different from the first process, wherein the second thickness is greater than the first thickness; and
densifying the gate dielectric film using a third process that is different from the first and second processes,
wherein the first thickness of the interface film is unchanged after the densifying of the gate dielectric film.

2. The method of claim 1, wherein there is no loss of the fin structure after the densifying of the gate dielectric film.

3. The method of claim 1, wherein the interface film and the gate dielectric film are formed with a same material.

4. The method of claim 1, wherein the first process is thermal oxidation, the second process is atomic layer deposition, and the third process is oxygen plasma processing.

5. The method of claim 4, wherein a process temperature during the second process and a process temperature during the third process are both lower than a process temperature during the first process.

6. The method of claim 5, wherein the process temperature during the third process is 300° C. to 700° C.

7. The method of claim 4, wherein the oxygen plasma processing provides a process gas by injecting an oxygen-containing gas into an inert gas.

8. The method of claim 7, wherein the inert gas is helium (He) and the oxygen-containing gas is one selected from $O_2$ and $N_2O$.

9. The method of claim 8, wherein a value of $O_2/(He+O_2)$ in the process gas is a maximum of 0.5.

10. The method of claim 4, wherein the oxygen plasma processing is one of a remote oxygen plasma method and a direct oxygen plasma method.

11. A method of fabricating a semiconductor device, the method comprising:
forming a multi-layer dielectric film structure on a substrate on which a fin structure is formed, wherein the multi-layer dielectric film structure comprises a plurality of dielectric films that are stacked;
performing oxygen plasma processing on the substrate; and
forming a gate line on the multi-layer dielectric film structure that has undergone the oxygen plasma processing,
wherein the fin structure is not lost during the performing of the oxygen plasma processing,
wherein the multi-layer dielectric film structure comprises a lower dielectric film and an upper dielectric film, and
wherein a thickness of the lower dielectric film is less than a thickness of the upper dielectric film.

12. The method of claim 11, wherein the performing of the oxygen plasma processing comprises performing the oxygen plasma processing at a temperature of 300° C. to 700° C.

13. The method of claim 11, wherein the performing of the oxygen plasma processing comprises performing the oxygen plasma processing using an oxygen radical.

14. The method of claim 11, wherein a process temperature for forming the lower dielectric film is higher than a process temperature for forming the upper dielectric film.

15. A method of fabricating a semiconductor device, the method comprising:
- forming a fin structure on a substrate;
- forming a source/drain region on the fin structure;
- forming a first silicon oxide film having a first thickness on the fin structure;
- forming a second silicon oxide film having a second thickness on the first silicon oxide film, wherein the second thickness is greater than the first thickness;
- performing plasma processing on the substrate; and
- forming a gate line on the fin structure, wherein the gate line extends in a direction that crosses the fin structure, and wherein the gate line faces the source/drain region.

16. The method of claim 15, wherein the performing of the plasma processing comprises performing the plasma processing at a temperature of 300° C. to 700° C.

17. The method of claim 15, wherein the performing of the plasma processing comprises injecting an oxygen-containing gas into an inert gas, wherein the inert gas is helium (He), and wherein the oxygen-containing gas is one selected from $O_2$ and $N_2O$.

18. The method of claim 15, wherein a degree of oxidation of the second silicon oxide film increases after the performing of the plasma processing.

19. The method of claim 15, wherein a strain between silicon and oxygen in the second silicon oxide film decreases after the performing of the plasma processing.

* * * * *